(12) United States Patent
Fisher

(10) Patent No.: US 7,106,774 B2
(45) Date of Patent: Sep. 12, 2006

(54) PLACING A SEMICONDUCTOR LASER ELECTRICALLY IN SERIES WITH A SEMICONDUCTOR OPTICAL AMPLIFIER

(75) Inventor: Aaron Fisher, Allentown, PA (US)

(73) Assignee: T-Networks, Inc., Allentown, PA (US)

( * ) Notice: Subject to any disclaimer, the term of this patent is extended or adjusted under 35 U.S.C. 154(b) by 321 days.

(21) Appl. No.: 10/644,570

(22) Filed: Aug. 20, 2003

(65) Prior Publication Data
US 2004/0042069 A1 Mar. 4, 2004

Related U.S. Application Data

(60) Provisional application No. 60/406,409, filed on Aug. 28, 2002.

(51) Int. Cl.
*H01S 5/00* (2006.01)
*H01S 3/00* (2006.01)

(52) U.S. Cl. ..................... 372/46.1; 359/344

(58) Field of Classification Search ............. 372/46.01; 359/344
See application file for complete search history.

(56) References Cited

U.S. PATENT DOCUMENTS

| | | | | |
|---|---|---|---|---|
| 5,530,585 A | | 6/1996 | Reid et al. | 359/334 |
| 5,539,571 A | * | 7/1996 | Welch et al. | 359/344 |
| 5,835,261 A | * | 11/1998 | Tamanuki et al. | 359/344 |
| 6,141,477 A | | 10/2000 | Kitamura | 385/131 |
| 6,167,073 A | * | 12/2000 | Botez et al. | 372/46.01 |
| 6,323,507 B1 | * | 11/2001 | Yokoyama et al. | 257/79 |
| 6,381,066 B1 | | 4/2002 | Korn et al. | 359/344 |
| 6,445,724 B1 | * | 9/2002 | Abeles | 372/50.124 |
| 6,839,364 B1 | * | 1/2005 | Broutin et al. | 372/20 |
| 2002/0075918 A1 | * | 6/2002 | Crowder | 372/38.02 |

OTHER PUBLICATIONS

Johnson et al. Basic Electric Circuit Analysis. 3rd Edition. Prentice-Hall. 1986. pp. 19-24.*
T. L. Koch et al.; Semiconductor Photonic Integrated Circuits; IEEE Journal of Quantum Electronics, Mar. 1991, pp. 641-653; vol. 27, No. 3.
N. K. Dutta et al.; Optical Sources for Telecommuniction; The Communications Handbook, Second Edition; Apr. 29, 2002; Part IV, Chapter 46, vol. 26; University of California, Santa Barbara, California, USA.
D. J. Blumenthal; Semiconductor Optical Amplifiers; The Communications Handbook, Second Edition; Apr. 29, 2002; Part IV, Chapter 51, vol. 26; University of California, Santa Barbara, California, USA.

* cited by examiner

*Primary Examiner*—Deandra M. Hughes
(74) *Attorney, Agent, or Firm*—RatnerPrestia

(57) ABSTRACT

An amplified laser comprising a semiconductor laser and semiconductor optical amplifier (SOA) mounted on a substrate such that an optical signal generated by the laser is optically coupled to the SOA. The SOA and laser are electrically coupled in a series configuration or a parallel configuration such that a single DC lead is needed to provide operational power and a single lead is needed to provide ground to both optical components. Additionally, a monolithic distributed feedback semiconductor laser (DFB) and SOA device comprising a substrate, a diffraction grating formed on the substrate, an active layer waveguide extending over the substrate and grating, a semiconductor layer formed over the active layer, and an electrical contact layer including varying resistive elements formed on the semiconductor layer. Either device may be contained in an industry standard 7-PIN electro-absorption modulated laser (EML) package.

8 Claims, 12 Drawing Sheets

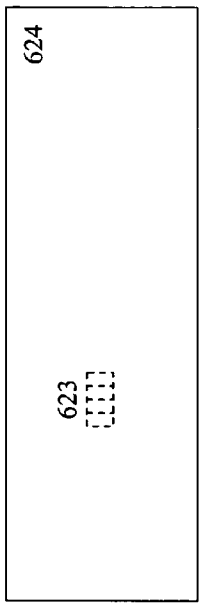
Figure 6B
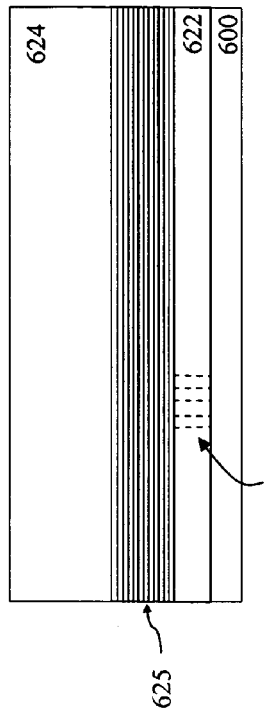
Figure 6C
Figure 6D
Figure 6E
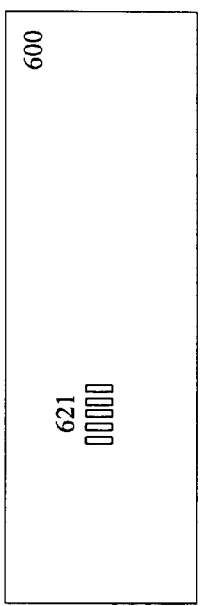
Figure 6F
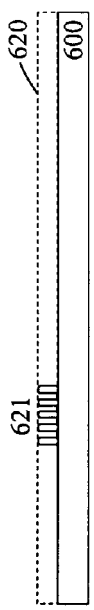
Figure 6G
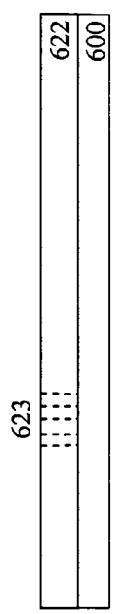
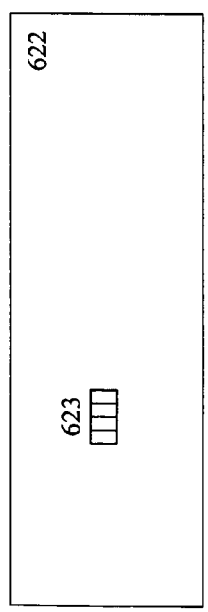
Figure 6H
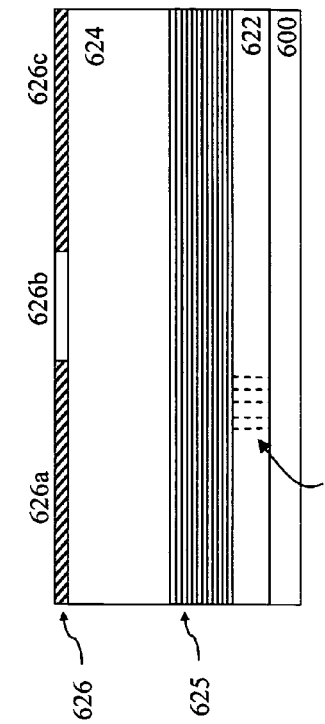

PLACING A SEMICONDUCTOR LASER ELECTRICALLY IN SERIES WITH A SEMICONDUCTOR OPTICAL AMPLIFIER

RELATED APPLICATION

This application claims the benefit of priority to U.S. Provisional Patent Application Ser. No. 60/406,409, filed on Aug. 28, 2002, the contents of which are incorporated in this application by reference.

TECHNICAL FIELD

The present invention relates generally to optical components for telecommunications and, more particularly, to an integrated semiconductor optical amplifier-semiconductor laser package.

BACKGROUND OF THE INVENTION

In the field of optical communications, it may be desirable to amplify optical signals that are being generated and transmitted to increase output signal power and/or to compensate for various losses due to optical components, (e.g., coupling losses). Traditionally, this has been done by converting the optical signal into an electrical signal, amplifying the electrical signal, and then converting it back to an optical signal. This is an inefficient process and requires a number of additional components. In response to the need for direct optical amplification, optical amplifiers such as semiconductor optical amplifiers (SOAs) and Erbium doped fiber amplifiers (EDFAs) have been developed. An optical amplifier is an element that has an optical amplification medium, which is able to amplify an optical signal directly without first converting it to an electrical signal. SOAs have the additional advantage of being very compact and thus may be included within a transmitter package. Therefore, SOAs have become an important part of integrated optical devices and have allowed the integration of many optical components into smaller form factor packages.

In a direct amplifying application, it may be desirable for an SOA to be optically coupled directly to a semiconductor laser, and for both components to be housed in a single package. The addition of an electrical lead to provide operational power to the SOA, however, may lead to packaging difficulties. In many applications this is undesirable and an additional DC lead to operate an SOA is not provided in commonly used standard packages, such as the industry standard 7-PIN electro-absorption modulated laser (EML) package. The higher optical output power of these devices are desirable, but no pins are available for the additional power connections. Any changes to the package are undesirable due to compatibility considerations in pre-existing optical communications systems. Even if an additional DC lead were provided, the inclusion of an additional power supply to drive the SOA raises further compatibility issues within pre-existing optical communications systems that have only a single supply available to generate the optical signal. Therefore, the inclusion of SOAs within such standard packages has been problematic.

SUMMARY OF THE INVENTION

One exemplary embodiment of the present invention is an amplified laser that includes a substrate, a semiconductor optical amplifier (SOA) coupled to the substrate, and a semiconductor laser coupled to the substrate. The SOA includes an amplifier anode electrode and an amplifier cathode electrode. The semiconductor laser includes a laser anode electrode and a laser cathode electrode. The semiconductor laser and the SOA are configured on the substrate so that an optical signal from the laser is optically coupled to the SOA. At least one of the laser anode electrode and laser cathode electrode is electrically coupled to at least one of the SOA anode electrode and SOA cathode electrode.

In an alternative exemplary embodiment, the present invention provides a monolithic amplified semiconductor laser including a substrate, an active layer formed on the substrate, a semiconductor layer formed on the active layer, and an electrical contact layer formed on the semiconductor layer. The monolithic amplified semiconductor laser further includes a distributed feedback laser (DFB) portion that includes a diffraction grating and a semiconductor optical amplifier (SOA) portion. The active layer of the exemplary monolithic amplified semiconductor laser further extends over the DFB portion and the SOA portion and includes a first end and a second end. The electrical contact layer of the exemplary monolithic amplified semiconductor laser further includes two electrode portions joined by a resistive coupler to control the current distribution between the DFB portion and the SOA portion of the monolithic amplified semiconductor laser.

Any of these exemplary embodiments of the present invention may be further included in an optical component package, such as the industry standard 7-PIN EML package.

It is to be understood that both the foregoing general description and the following detailed description are merely exemplary, and are not restrictive, of the present invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures according to the present invention:

FIGS. 6B, 6D, and 6F are top plan drawings of an exemplary embodiment of the present invention during manufacture, according to the flow chart in FIG. 6A; and FIGS. 6C, 6E, 6G, and 6H are side plan drawings of an exemplary embodiment of the present invention during manufacture, according to the flow chart in FIG. 6A.

DETAILED DESCRIPTION OF THE INVENTION

The present invention provides a method for increasing optical output power from an optical signal source without using additional electrical connections or an additional power supply.

Figure 1A:
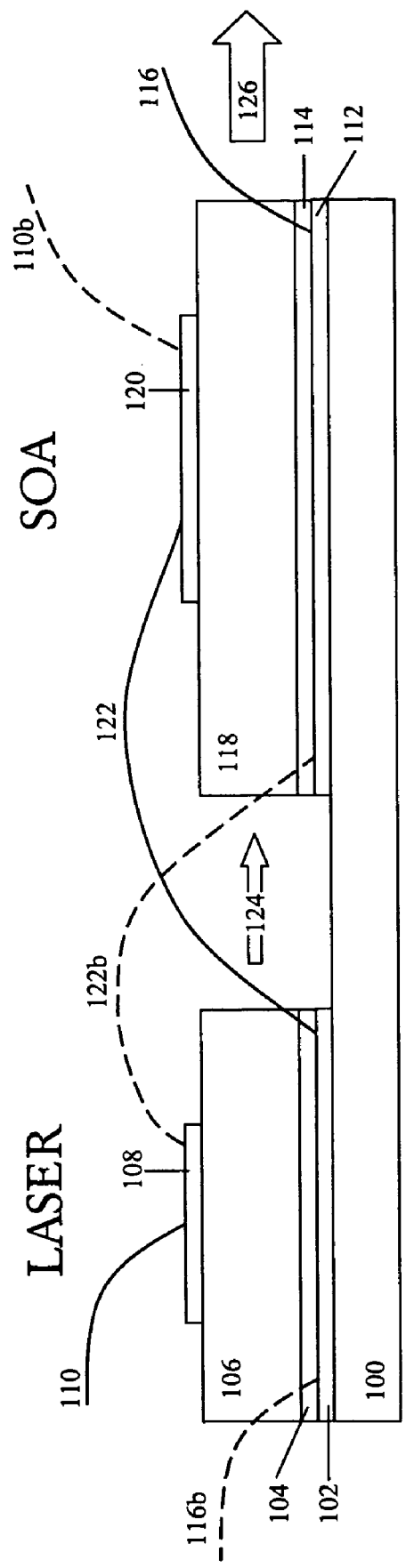
FIG. 1A is a cross-sectional side plan drawing of an exemplary integrated semiconductor laser and SOA chip utilizing a series circuit connection for drive current.

Referring now to the drawings, in which like reference numbers refer to like elements throughout the various Figures that comprise the drawing, FIG. 1A shows one exemplary embodiment of the invention. In this embodiment the laser and SOA are electrically coupled in a series configuration in which the cathode of the laser electrically coupled to an anode of the SOA. A current source (not shown) supplies current, which flows through laser 106 and then through the SOA 118 in series. Both laser 106 and through the SOA 118 are desirably mounted on the same insulating substrate 100 so that optical signal 124 from laser 106 may be optically coupled directly into SOA 118. Amplified signal 126 is emitted from the opposite end of SOA 118. The cathode of laser 106 may be coupled to conductive pad 102 by coupling layer 104, desirably a conductive solder or epoxy providing both mechanical and electrical coupling. Similarly, the cathode of SOA 118 may be coupled to conductive pad 112 by coupling layer 114, also desirably a conductive solder or epoxy providing both mechanical and electrical coupling.

The cathode of the SOA 118 is electrically coupled to case ground by bond 116 and the anode of laser 106 is electrically coupled to a current source, through a direct current (DC) pin (not shown) of the package (not shown), by bond 110, which is coupled to anode contact 108 of laser 106. The cathode of laser 106 is electrically coupled to the anode of the SOA 118 by bond 122, which couples conductive pad 102 to the anode contact 120 of the SOA.

This configuration may also be reversed, as shown by the dashed bonds in FIG. 1A, with the cathode of SOA 118 electrically coupled to the anode of laser 106 by bond $122_b$. In this alternate exemplary embodiment, the cathode of the laser is electrically coupled to case ground by bond $116_b$, and the anode of the SOA is electrically coupled to the DC pin, by bond $110_b$.

Figure 2A:
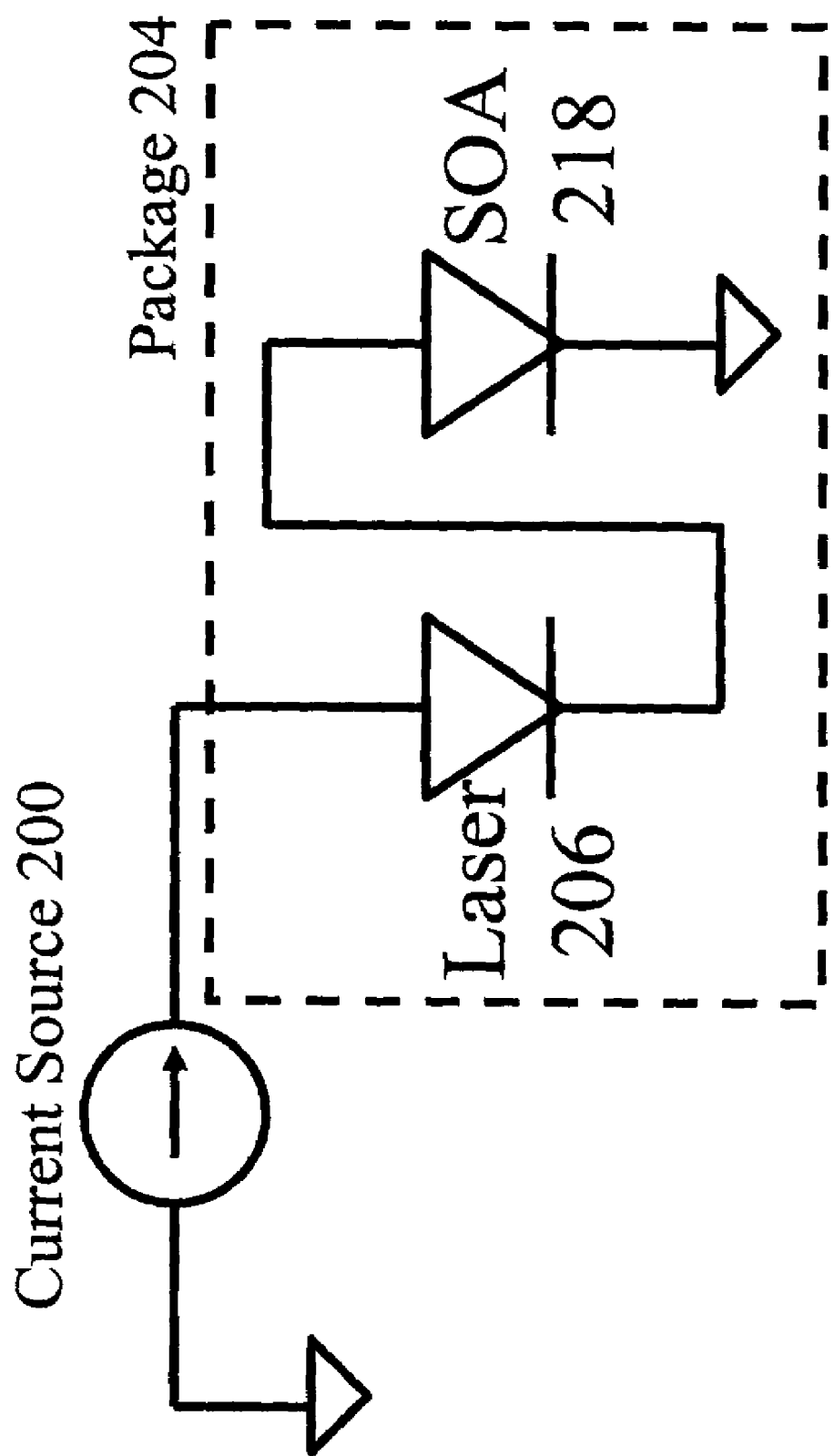
FIG. 2A is a schematic diagram of an exemplary configuration of an SOA in series with a semiconductor laser.

An exemplary schematic configuration for operating SOA 208 and semiconductor laser 206 electrically coupled in series is shown in FIG. 2A. In this exemplary circuit, all of the current that passes through laser 206 also passes through SOA 218. The voltage supplied by current source 200 is the summation of voltage drop of laser 206 and voltage drop of SOA 218. This sum may typically be between 2.5 and 3V for typical drive currents of 30–150 mA.

In this exemplary embodiment, the optical output signal of the laser is amplified by the SOA. The resultant optical signal may have significantly higher optical power than the optical signal of the laser alone, with the component operating at the same current level as the individual laser. It is noted that the voltage requirements on current source 200 are increased compared to the operation of a laser device. In many situations, however, higher drive voltages are readily available but are dissipated in current source 200 to maintain desired current levels.

Figure 1B:
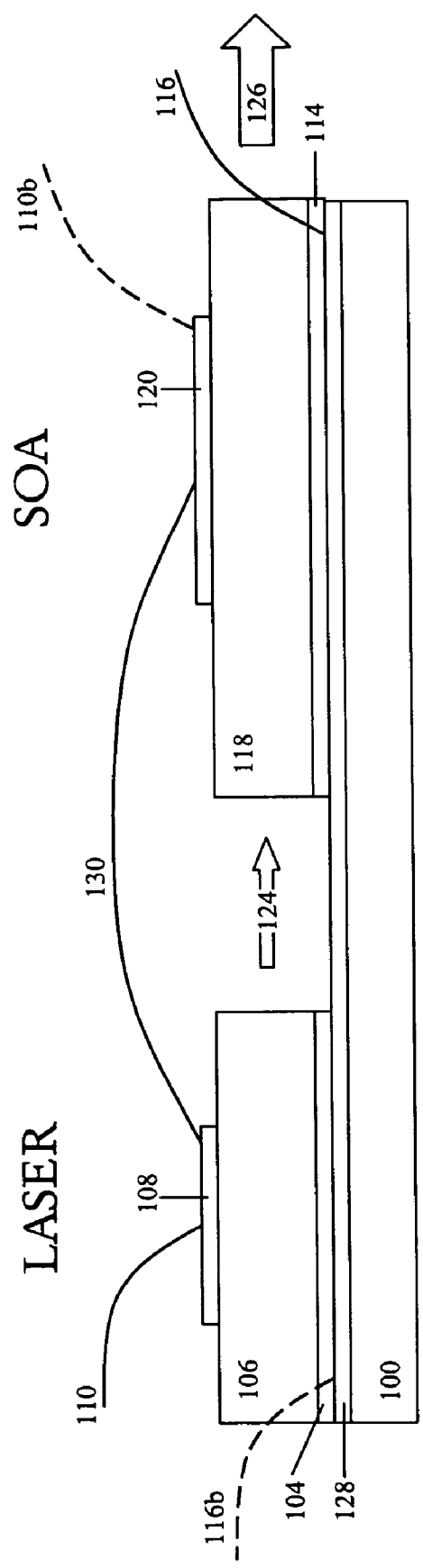
FIG. 1B is a cross-sectional side plan drawing of another exemplary integrated semiconductor laser and SOA chip utilizing a parallel circuit connection for drive current.

To reduce the voltage requirements of the supply, at the expense of increased current, an alternate exemplary embodiment, electrically couples laser 106 and SOA 118 in parallel, as shown in FIG. 1B. In this exemplary embodiment, the cathode of the laser is electrically coupled to the cathode of the SOA and the anode of the SOA is electrically coupled to the anode of the laser. Both devices may desirably be coupled to substrate 100 so optical signal 124 may be optically coupled into SOA 118, with amplified signal 126 emitted from the opposite end of SOA 118. Both cathodes may desirably be electrically coupled to each other through common conductive pad 128, which extends under both devices, and then to case ground through bond 116 (and/or $116_b$ in an alternate embodiment). Additionally, anode contacts 108 and 120 may be coupled through bond 130, and electrically coupled to a DC pin on the package through bond 110 (and/or $110_b$ in an alternate embodiment). Bond 130 may be omitted if both anode contacts 108 and 120 are coupled directly to the same DC lead by bonds 110 and $110_b$, respectively.

Figure 3A:
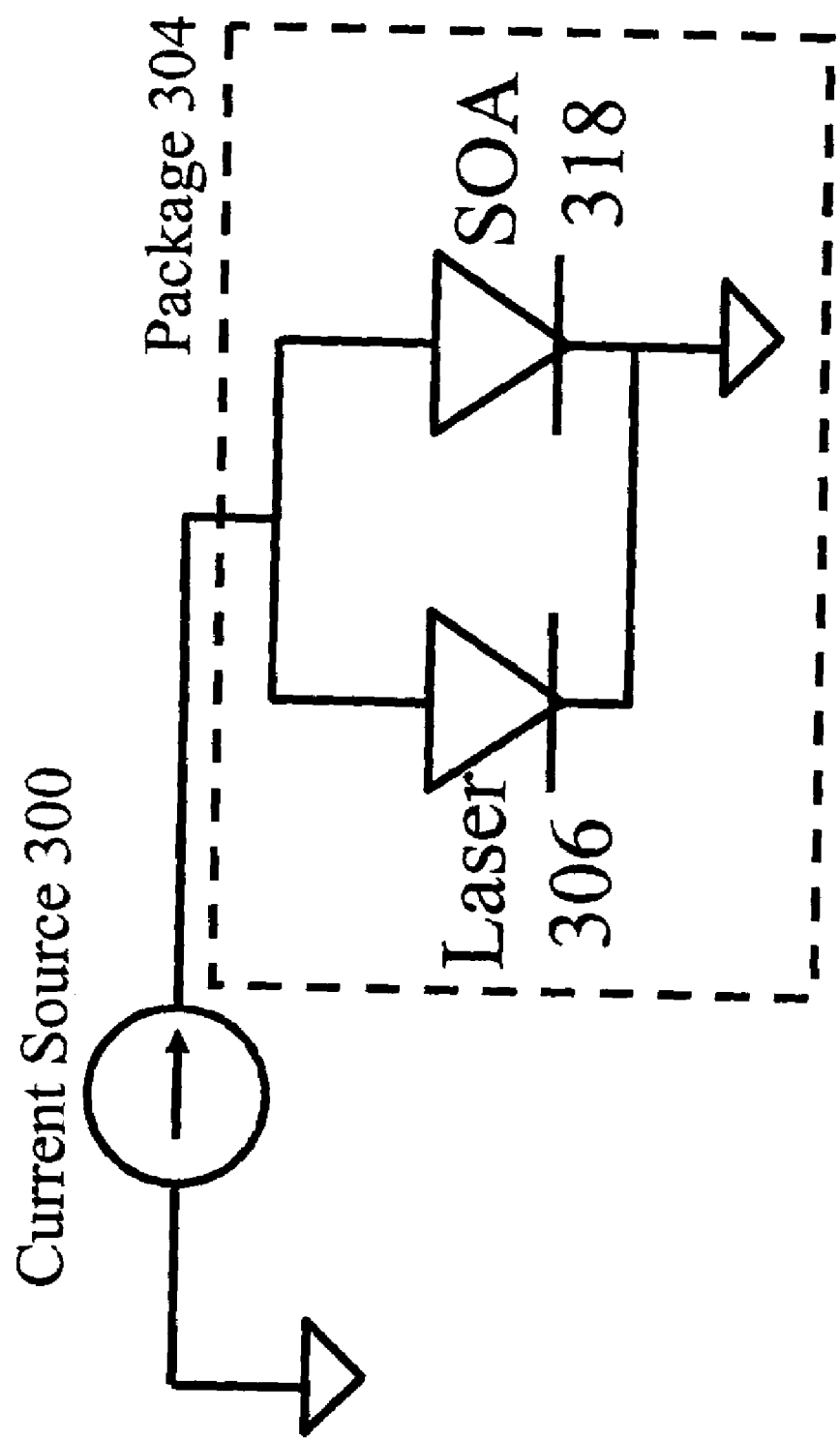
FIG. 3A is a schematic diagram of an exemplary configuration of an SOA in parallel with a semiconductor laser.

An exemplary schematic configuration for operating SOA 318 and semiconductor laser 306 electrically coupled in parallel is shown in FIG. 3A. In this exemplary circuit, the current is divided between laser 306 and SOA 318. The current flowing from current source 300 is the summation of current flowing through laser 306 and current flowing through SOA 318. The voltage drop across each device is the same. Although this parallel circuit embodiment may require greater current than the series circuit embodiment described with respect to FIG. 2A, it is contemplated that the electrical coupling of the cathodes of both laser 306 and SOA 318 to a common case ground may simplify assembly of an integrated amplified laser, as shown in FIG. 1B.

Figure 2B:
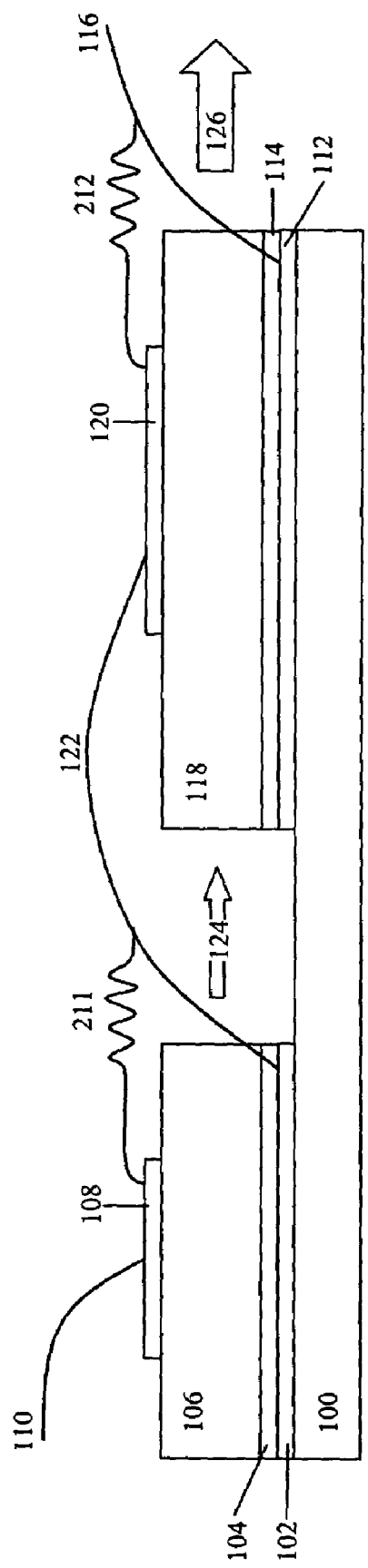
FIG. 2B is a cross-sectional side plan drawing of an exemplary configuration of an SOA in series with a semiconductor laser with current control resistors included.
Figure 3B:
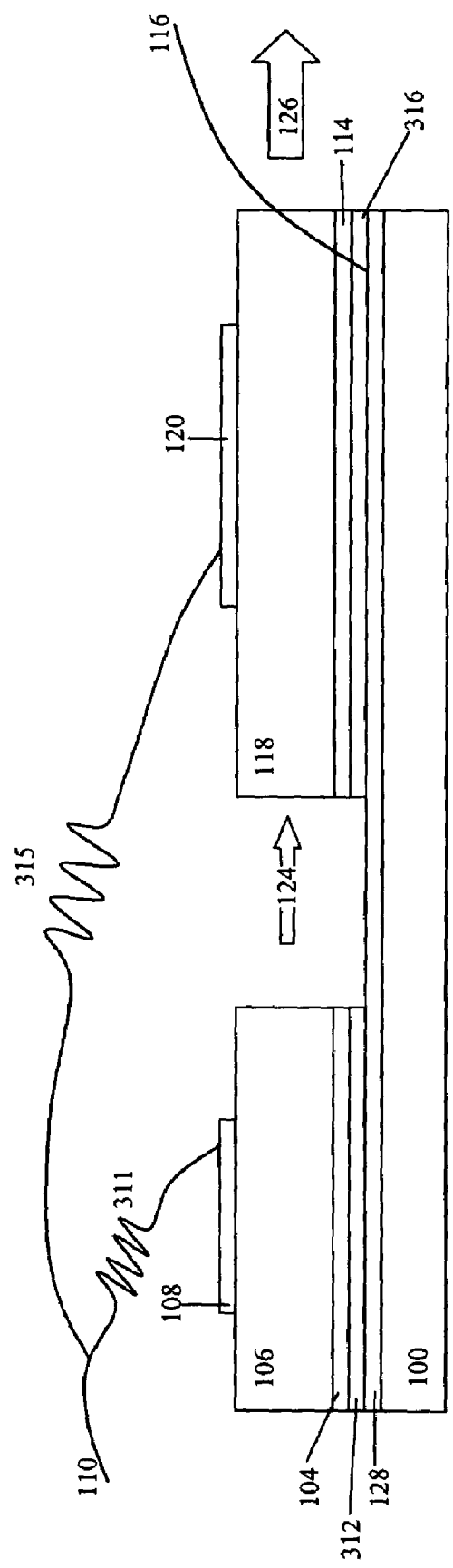
FIG. 3B is a cross-sectional side plan drawing of an exemplary configuration of an SOA in parallel with a semiconductor laser with current control resistors included.

FIGS. 2B and 3B show alternative exemplary embodiments of a series configuration and a parallel configuration, respectively, which include resistors for control of the drive current flowing through laser 106 and/or SOA 118. In FIG. 2B, resistor 211 may be coupled to contact 108 and bond 122 to act as a shunt resistance in parallel with the laser, allowing control of current through the laser. Additionally, resistor 212 may be coupled to contact 120 and bond 116 to act as a shunt resistance in parallel with the amplifier, allowing control of current through the amplifier. In FIG. 3B, resistor 311, and/or resistance layer 312 may desirably serve as resistance in series with the laser to control the current through the laser. Additionally, resistor 315, and/or resistance layer 316 may desirably serve as resistance in series with the SOA to control the current through the SOA.

Any of resistors 211, 212, 311 and 315 may be variable resistors (e.g. laser trimmed) to allow for calibration of the current division, and thus the gain division, between the laser and the SOA in either of these exemplary configurations. These calibrations may be performed during manufacture or access to the variable resistor(s) may be provided in the package (e.g. via a transparent window) to allow tuning during operation.

While the exemplary embodiments shown in FIGS. 2B and 3B incorporate a plurality of resistors, it may be understood by those skilled in the art that other electronic devices may be used in one or more of the locations indicated as resistors in these figures. For example, an RLC network may be used in place of one or more of the resistors in order to act as a high, low, or band pass filter, for example, reducing noise due to signal modulation by an optical modulator within the package, such as an electro-absorption modulator (EAM) or a Mach-Zehnder interferometer (MZI). As another example, an integrated circuit may be used in place of one or more of the resistors in order to act as a dynamic current divider, allowing a greater fraction of the current (electrical power) to reach the laser during low power operation and a greater fraction of the current (electrical power) to reach the SOA during high power operation.

In an alternate embodiment of the present invention, a parallel circuit may be achieved by using a monolithic distributed feedback semiconductor laser (DFB) and SOA device, as shown in FIGS. 4A–D. In reference to FIG. 4A, the monolithic DFB and SOA device includes substrate 400, grating portion 402, active layer 404, semiconductor layer 406, electrical contact layer 408, and antireflective output coupler 410. Substrate 400 may desirably be an n-type III/V material, such as InP, GaAs, InGaAsP, InSb, or AlGaAs, and serve as the cathode connection for the device. Alternatively, substrate 400 may be a p-type III/V material and serve as the anode connection. A portion of substrate 400 is processed to create a periodic variation in the refractive index, forming an optical diffraction grating in grating portion 402.

Active layer 404, which may be a bulk gain material or may include a quantum well structure, is formed over substrate 400 including grating portion 402. Active layer 404 provides a gain medium and waveguide for both DFB portion 416 and SOA portion 418 of the device, and may desirably be an n- or p-type III/V material, with index of refraction greater than that of substrate 400 to provide optical confinement.

Figure 4A:
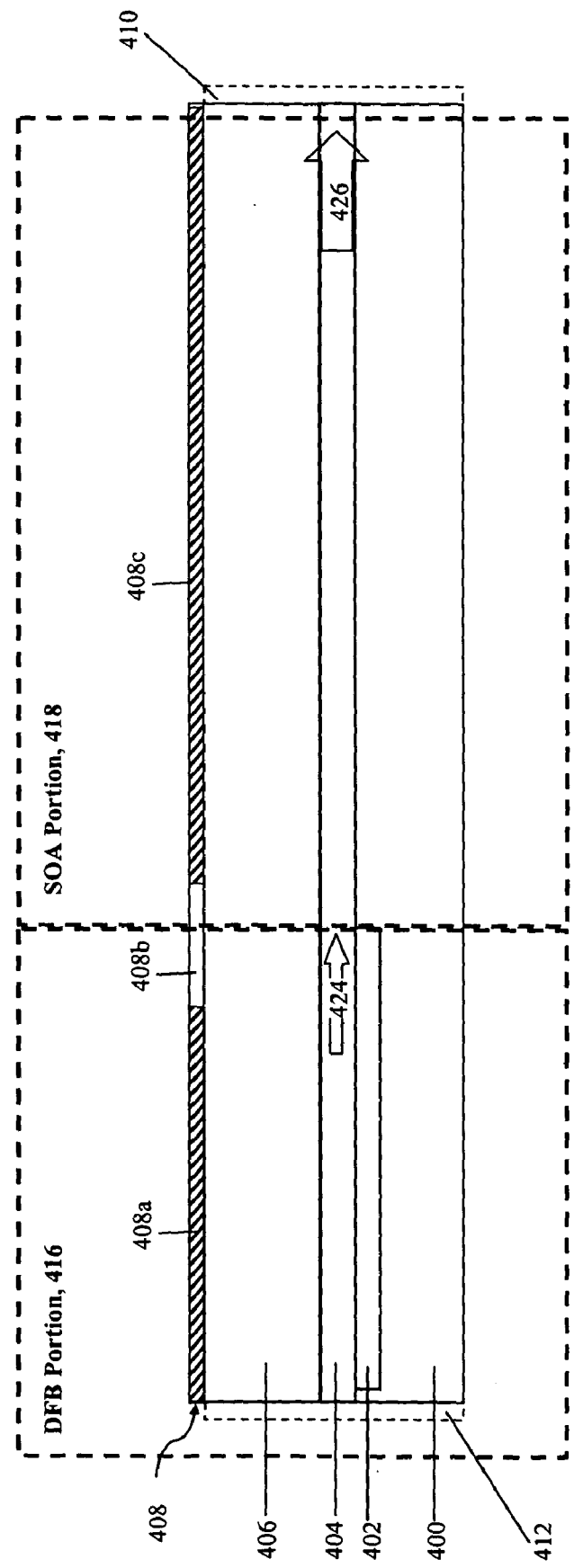
FIG. 4A is a cross-sectional side plan drawing of an exemplary embodiment of a monolithic distributed feedback (DFB) semiconductor laser and SOA in a parallel circuit configuration.
Figure 4C:
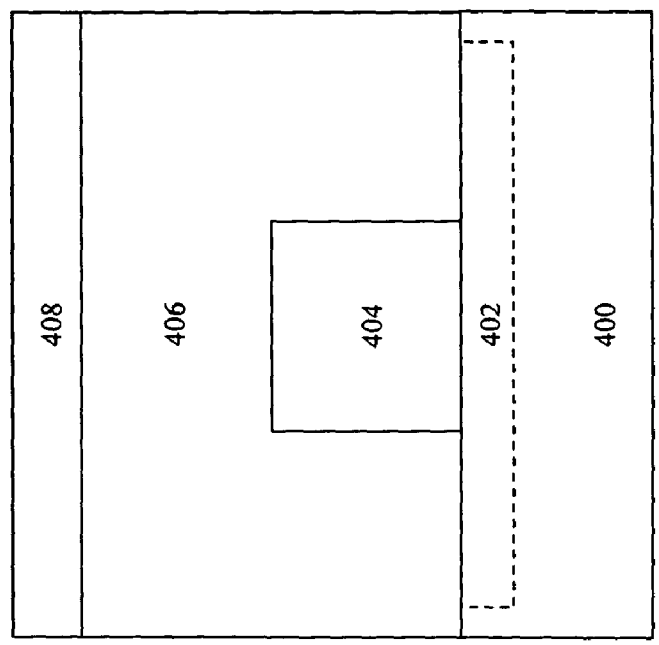
FIG. 4C is a front plan drawing of an alternate exemplary embodiment of a monolithic DFB and SOA device in a parallel circuit configuration.
Figure 4B:
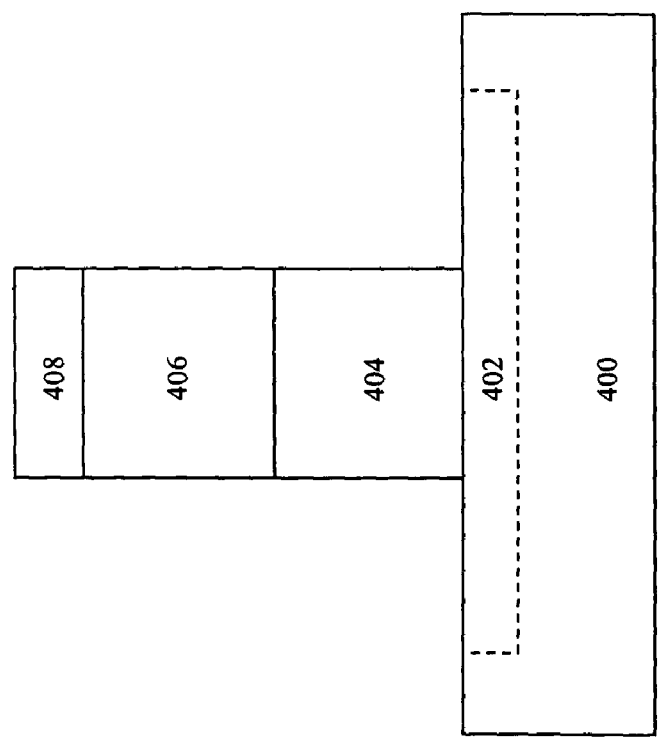
FIG. 4B is a front plan drawing of an exemplary embodiment of a monolithic DFB and SOA device in a parallel circuit configuration.

Semiconductor layer 406 is formed over active layer 404 and may desirably include III/V material of a conductivity type different than that of substrate 400. The semiconductor layer 406 may provide passivation to the active layer 404. FIGS. 4B and 4C show exemplary constructions of the monolithic DFB and SOA device of FIG. 4A from end view of the rear facet. In one exemplary construction, shown in FIG. 4B, substrate 400 and grating 402 serve as a base for a mesa structure of active layer 404. Semiconductor layer 406 is formed directly above active layer 404 and electrical contact layer 408 is formed directly above semiconductor layer 406. In an alternate exemplary construction, shown in FIG. 4C, substrate 400 and grating 402 serve as a base for a covered mesa structure of active layer 404. Semiconductor layer 406 is formed directly above and around active layer 404 and electrical contact layer 408 is formed directly on top of semiconductor layer 406. The indices of refraction and/or the bandgaps of substrate 400 and semiconductor layer 406 may also be selected to increase optical and/or carrier confinement within active layer 404, and may desirably be less than that of active layer 404.

Figure 4D:
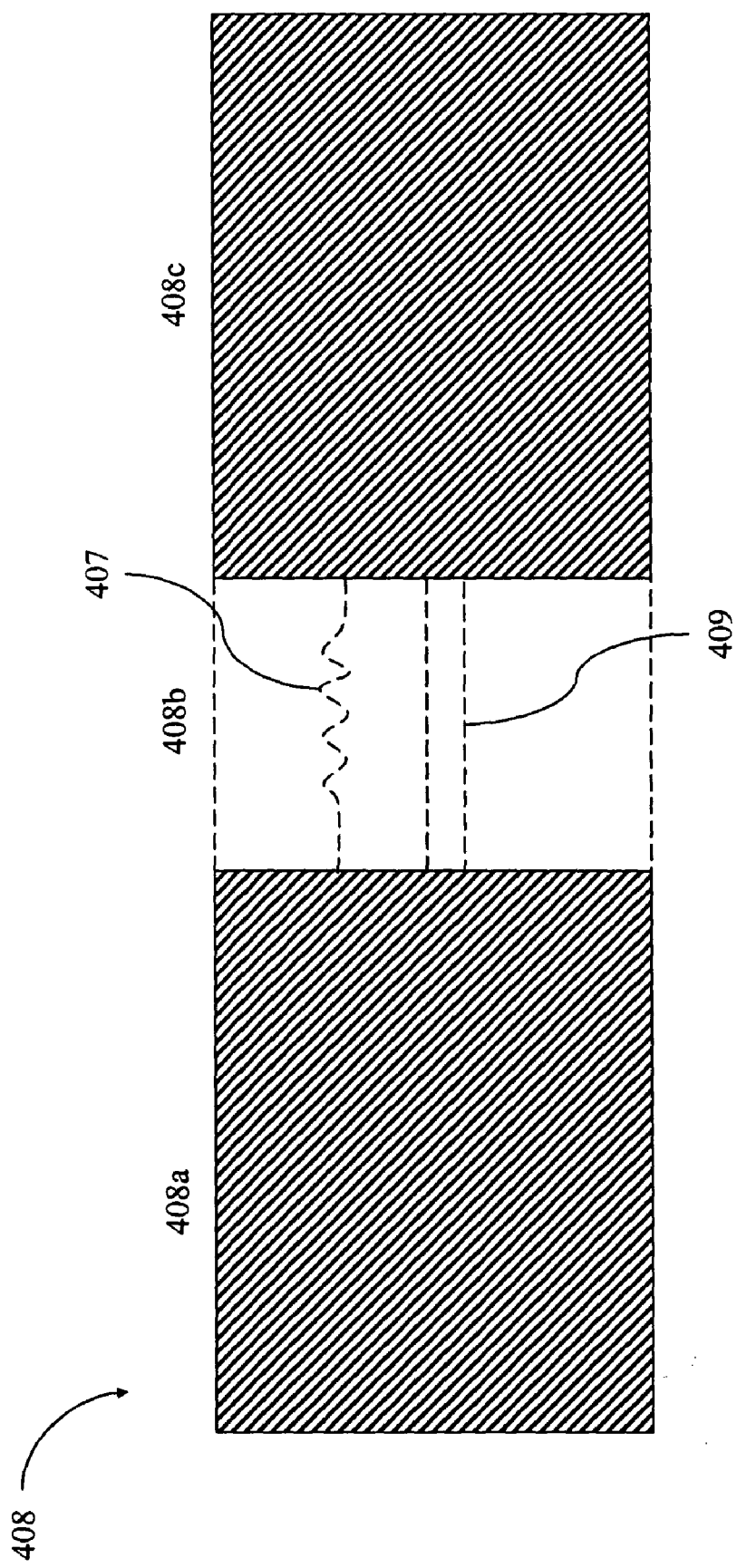
FIG. 4D is a top plan drawing of an exemplary electrical contact layer of the exemplary monolithic DFB and SOA device.

As shown in FIG. 4D, electrical contact layer 408 includes DFB electrode portion $408_a$, SOA electrode portion $408_c$, and resistive coupler $408_b$ joining the electrodes. The electrode portions may be formed from a material of a high conductivity type, such as aluminum, gold, silver, copper, nickel, titanium, tungsten, platinum, germanium, polyaniline, polysilicon, or a combination of these materials.

The resistive coupler serves to control the current division between the DFB portion and the SOA portion and may be implemented by various embodiments. If the current source is coupled to DFB electrode portion $408_a$, then resistive coupler $408_b$ desirably acts as a resistor in series with SOA portion 418, thereby reducing current density and thus the optical gain within the SOA portion relative to DFB portion 416. If the current source is coupled to SOA electrode portion $408_c$, then resistive coupler $408_b$ desirably acts as a resistor in series with DFB portion 416, thereby reducing current density and thus the optical gain within the DFB portion relative to SOA portion 418. The doping levels of substrate 400, active layer 404, and semiconductor layer 406 are desirably low enough that lateral carrier diffusion within these layers is unable to equalize the carrier densities of DFB portion 416 and SOA portion 418. For doping levels typically used in DFBs and SOAs, approximately $1\times10^{16}$ to $8\times16^{17}$ atoms/cm$^3$, excess lateral diffusion may be desirably avoided.

In one embodiment, resistive coupler $408_b$ is formed of the same material as the remainder of electrical contact layer 408. The conductive material within resistive coupler $408_b$ may be formed as a thinner layer than with the electrode portions $408_a$ and $408_c$, and/or patterned to form narrow wire 409 (shown in phantom). The resulting constriction may provide a resistance to divide current appropriately between DFB portion 416 and SOA portion 418.

In another embodiment, resistor 407 (shown schematically in phantom) may be electrically coupled between the two electrode portions $408_a$ and $408_c$. Resistor 407 may be a standard resistor bonded to DFB electrode portion $408_a$ and SOA electrode portion $408_c$, or it may be a resistive ink wire formed on the device. It is understood by those skilled in the art that any of the above mentioned schemes, as well as many other schemes, will serve to desirably control current division between the DFB and SOA portions of the device.

Grating layer 402 provides the feedback necessary for lasing action in the portion of active layer 404 formed above grating layer 402, thereby defining the DFB portion 416 of the monolithic DFB and SOA device. The rear facet is desirably a cleaved facet and may also desirably be a reflector, and thus grating layer 402 is not restricted to extending completely to the rear facet. It is noted that substantially reflective coating 412 may be formed on the rear facet of the device to increase feedback within DFB portion 416. Reflective coating 412 may include a dielectric mirror, or other reflective surface coating such as a metallization layer.

The remaining portion of the device forms SOA portion 418, in which optical signal 424 is amplified with minimal feedback in a substantially travelling wave mode. Substantially antireflective output coupler 410 may desirably be formed on the output surface of the device to lower feedback within SOA portion 418 and to allow improved transmission of the amplified optical signal 426. Antireflective output coupler 410 may include an antireflective coating, a tilted surface, or buried facets.

Figure 6A:
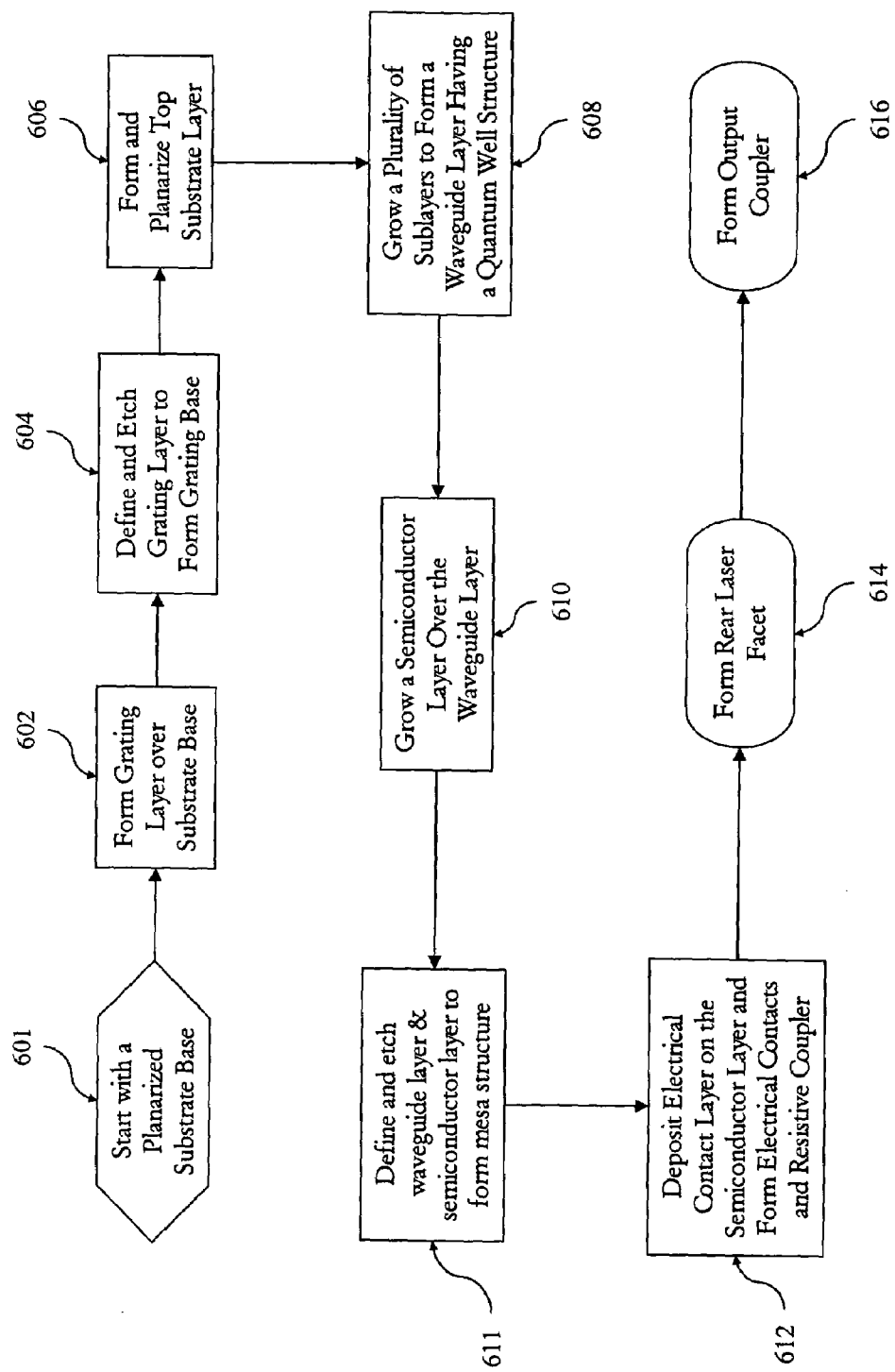
FIG. 6A is a flow chart showing an exemplary method of manufacture of an embodiment of the present invention.

FIG. 6A is a flowchart describing an exemplary method of manufacture for producing an exemplary monolithic DFB and SOA device according to the present invention. FIGS. 6B–H illustrate various steps of this exemplary fabrication process.

The process begins with a planarized substrate base, step 601. Substrate base 600 is desirably formed from a III/V semiconductor, such as InP, GaAs, or InGaAsP. The substrate base may also be formed of multiple layers such as GaAs grown on silicon or alumina. A grating layer 620 is formed over substrate base 600, step 602. Metal organic chemical vapor deposition (MOCVD) is one exemplary method that may be used for deposition of this grating layer, but other epitaxial deposition techniques may also be employed, such as molecular beam epitaxy (MBE) and chemical beam epitaxy (CBE). The grating layer 620 desirably has a sufficiently larger refractive index than substrate base 600 to provide the scattering desired for the optical grating section of the DFB portion of the exemplary device. This grating layer is also desirably formed of a material of the same family as substrate base 600. For example, an InP grating layer may desirably be formed on an InGaAsP substrate base.

A grating portion of the grating layer 620 is defined and etched to form grating base 621 with a series of parallel lines, step 604. These parallel lines may desirably be formed using a photolithographic technique, such as phase masking or e-beam writing, and a wet chemical etch. Alternatively, a dry etch technique, such as reactive ion etching, may be used. Grating base 621 is formed with a grating period selected to provide the desired feedback for the DFB portion. FIGS. 6B and 6C depict the exemplary monolithic DFB and SOA device at this stage of manufacture.

Top substrate layer 622 is formed over etched grating base 621 to form optical grating 623 and this layer is then planarized, step 606. MOCVD or another epitaxial deposition technique may be employed to form this layer. It may be desirable for the same deposition technique to be used to form all of the semiconductor layers in this exemplary method. Top substrate layer 622 desirably has a sufficiently lower refractive index than grating base 621, and desirably similar to substrate base 600, to provide the desired scattering for the optical grating section of the exemplary device. FIGS. 6D and 6E illustrate the in-process exemplary device at this point in its manufacture.

Substrate base 600 and top substrate layer 622, shown in FIGS. 6D and 6E, may function as both a cladding layer to assist in confinement of the beam in the active layer of the device and as the N layer of the P-I-N structure. (Although this description assumes that the substrate is the N side of the P-I-N structure, one skilled in the art will understand that the substrate could be the P side with the semiconductor layer 624 formed of N-type material instead.) Top substrate layer 622 also functions as the low refractive index portion of optical grating 623.

An alternative exemplary method may be employed to form optical grating 623. In this alternative method, a grating portion 620 is defined and etched to form a grating base with a series of parallel grooves. The grating layer is formed over this etched grating base to form optical grating 623, using MOCVD or another epitaxial deposition technique. This layer is then planarized. No top substrate layer is used in this alternative exemplary method. Substrate base 600 also functions as the low refractive index portion of optical grating 623 in this alternative embodiment.

Once the optical grating is formed, a bulk gain layer or a plurality of sub-layers making up a quantum well structure of active layer 625 are grown, step 608. MOCVD or another epitaxial deposition technique may be employed. The quantum wells and barriers may desirably be composed of $In_xGa_{(1-x)}As_yP_{(1-y)}$ materials, as well as $In_xAl_yGa_{(1-x)}As_{(1-y)}$ and $In_xGa_{(1-x)}As$ materials. Specific selections of x and y depend on the desired bandgap and strain, if any. These sub-layers may also be formed by other permutations of alloys formed from these elements. The bulk gain material or quantum wells and barriers of active layer 625 desirably have a sufficiently larger refractive index than the top substrate layer 622 so that the quantum wells and barriers may act as a waveguide.

Next, semiconductor layer 624 is formed over the waveguide layer, step 610. This step of the fabrication process is illustrated in FIGS. 6F and 6G. Desirably, semiconductor layer 624 is formed using the same deposition method as the active layer 625. The semiconductor layer desirably has a refractive index lower than active layer 625, desirably similar to that of top substrate layer 622, to ensure light confinement. Additionally, the semiconductor layer may be formed of a p-type material, for example, p-type InP or GaAs. Also, semiconductor layer 624 may be formed in multiple sub-layers.

If active layer 625 includes a quantum well structure, it may be desirable for the thickness of the sub-layers of active layer 625 and/or semiconductor layer 624 to be varied within the exemplary device to optimize performance of the waveguide. In this case, the exemplary method of manufacture includes an additional step (not shown) of depositing growth retardation sections before step 608. The growth retardation sections cause lateral diffusion of the material during deposition, leading to selective area growth the sub-layers of the quantum well structure of active layer 625, as well as semiconductor layer 624 if not removed before step 610.

The mesa structure of the exemplary monolithic DFB and SOA device is defined and etched, step 611. For example, the structure may be defined by selectively forming photoresist over the desired mesa structure. Next, active layer 625 and semiconductor layer 624 are etched to form this structure. Step 611 may be performed using standard wet or dry etch techniques. Although step 611 is shown following step 610 in FIG. 6A, it is contemplated that step 611 could alternatively take place between steps 608 and 610. In this case semiconductor layer 624 would be grown to encase active layer 625.

In step 612, an ohmic contact is deposited on semiconductor layer 624 to form electrodes $626_a$ and $626_c$, as shown in FIG. 6H. These electrodes provide operational power to the DFB and SOA portions of the exemplary device and may be formed of a conductive material, such as aluminum, gold, silver, copper, nickel, titanium, tungsten, platinum, germanium, polyaniline, polysilicon or a combination of these materials. Resistive coupler $626_b$ is also formed to desirably control current division between the DFB and SOA portions. Resistive coupler $626_b$ may be formed as a narrow wire of the conductive material along with electrodes $626_a$ and $626_c$, or as a thin layer of conduction material, desirably the same conduction material as electrodes $626_a$ and $626_c$. Alternatively, resistive coupler $626_b$ may be printed using resistive ink.

In step 614, the device is cleaved to form a rear facet and an output facet. This step may include the formation of a substantially reflective coating (not shown) on the rear facet of the device to increase feedback within the DFB portion. The cleaved rear facet of the DFB portion functions as a reflector for the laser. The relatively high index of refraction of the device materials desirably leads to a high reflectivity for this surface with only a small amount of leakage light. This reflectivity may be further increased by coating this surface with a metallization layer or several dielectric layers to form a dielectric mirror, if desired.

Further, in step 616, a substantially antireflective output coupler (not shown) may desirably be formed on the output surface of the device to lower feedback within the SOA portion and to allow improved transmission of an amplified optical signal. The output coupler may be anti-reflection coated to reduce losses and reflections. Additionally, the output coupler may be formed using a low-loss optical coupling technique such as a buried facet or a tilted surface.

Steps 614 and 616 may be carried out in interchangeable order and by any of a number of standard semiconductor fabrication techniques known to those skilled in the art.

Figure 5:
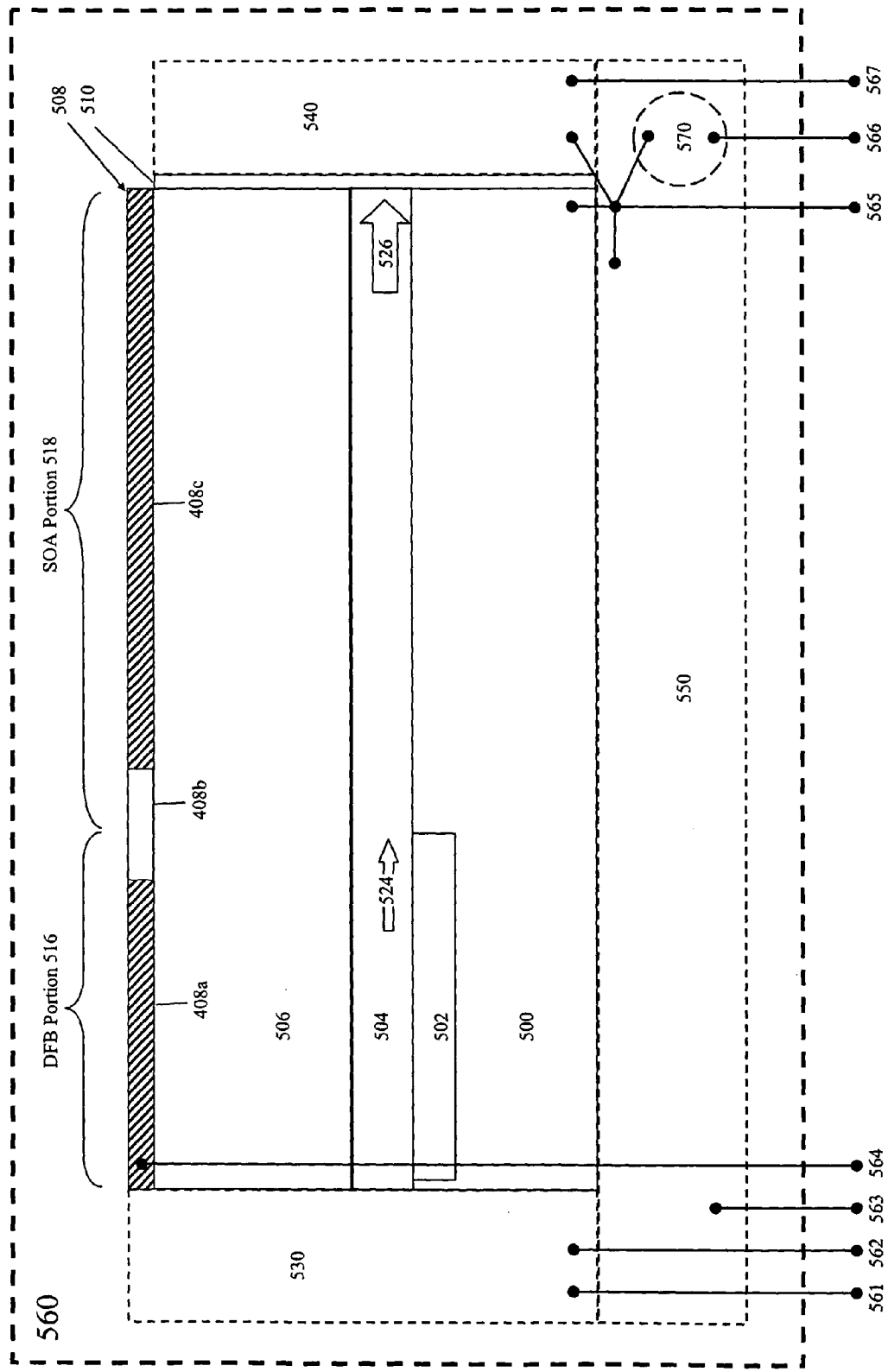
FIG. 5 is a cross-sectional side plan drawing of an exemplary embodiment of a monolithic DFB and SOA device in a 7-PIN EML package with included exemplary components.

FIG. 5 illustrates an exemplary embodiment of the monolithic DFB and SOA device mounted in a standard 7-PIN EML package 560 with typical EML components such as feedback monitor 530, optical modulator 540, thermo-electric cooler 550, and temperature sensor 570. It is understood that neither is the device restricted to use solely in a 7-PIN EML package nor is the package configuration restricted to the typical EML components included. Further, it is noted that the physical placement of the components as shown in FIG. 5 is merely exemplary and may be different in practice.

EML package 560 includes electrical pins 561, 562, 563, 564, 565, 566, and 567. Coupled to the rear facet of DFB potion 516 is feedback monitor 530 that monitors the optical signal 524 generated by DFB portion 516 of the device for external monitoring. Feedback monitor 530 desirably uses two of the outer electrical pins for operation (561 and 562 in the exemplary embodiment of FIG. 5).

Extending under and coupled to substrate 500 is thermoelectric cooler (TEC) 550. TEC 550 desirably maintains the temperature of the monolithic DFB and SOA device at a predetermined operating temperature range. TEC 550 uses one of the outer electrical pins for operation (563 in the exemplary embodiment of FIG. 5) and is coupled to device common ground through PIN 565.

Temperature sensor 570 is thermally coupled to the monolithic DFB and SOA device to sense operating temperature and to send control signals to TEC 550 for maintaining a desired temperature range. Temperature sensor 570 uses one of the outer electrical pins for operation (566 in the exemplary embodiment of FIG. 5) and is coupled to device common ground through pin 565.

Optical modulator 540 is desirably coupled to antireflective output coupler 510 to modulate output amplified optical signal 526. Modulator 540 uses one of the outer electrical pins for operation (567 in the exemplary embodiment of FIG. 5) and is coupled to device common ground through pin 565.

Further, in the exemplary configuration, pin 564 is coupled to electrical contact layer 508 and provides operational power to the device, while substrate 500 is coupled to device common ground through pin 565.pin descriptions and connection descriptions are merely exemplary, and may change based on the exemplary components contained in the package, the number of pins available on the package, and other design parameters.

While the invention has been described in terms of exemplary embodiments, it is contemplated that it may be practiced, as described above, with modifications within the scope of the claims.

What is claimed is:

1. An amplified laser comprising:
   a substrate,
   a semiconductor optical amplifier (SOA), coupled to the substrate and including an amplifier anode electrode and an amplifier cathode electrode,
   a semiconductor laser, coupled to the substrate and including a semiconductor laser anode electrode and a semiconductor laser cathode electrode, and
   an electro-absorption modulated laser (EML) package that encloses the semiconductor laser and the SOA, the EML package including:
      a first electrical contact electrically coupled to at least one of the anode electrode of the SOA or the anode electrode of the semiconductor laser;
      a second electrical contact electrically coupled to at least one of the cathode electrode of the SOA or the cathode electrode of the semiconductor laser; and
      an optical output port configured to provide an output amplified optical signal;
   wherein;
      the semiconductor laser and the SOA are configured on the substrate so that the laser is optically coupled to the SOA; and
      at least one of the semiconductor laser anode electrode or semiconductor laser cathode electrode is electrically coupled to at least one of the amplifier anode electrode or amplifier cathode electrode such that the semiconductor laser and the SOA are electrically connected in series.

2. The amplified laser of claim 1, wherein the cathode electrode of the semiconductor laser is electrically coupled to the anode electrode of the SOA whereby the semiconductor laser and SOA are connected in series.

3. The amplified laser of claim 2, further comprising an electronic component electrically coupled in parallel to at least one of the semiconductor laser or the SOA.

4. The amplified laser of claim 3, wherein the electronic component includes at least one of a resistor, a capacitor, an inductor, or an integrated circuit.

5. The amplified laser of claim 1, wherein the anode electrode of the semiconductor laser is electrically coupled to the cathode electrode of the SOA whereby the semiconductor laser and the SOA are connected in series.

6. The amplified laser of claim 5, further comprising an electronic component electrically coupled in parallel to one of the semiconductor laser or the SOA.

7. The amplified laser of claim 6, wherein the electronic component includes at least one of a resistor, a capacitor, an inductor, or an integrated circuit.

8. An amplified laser comprising:
   a substrate;
   a semiconductor optical amplifier (SOA), coupled to the substrate and including an amplifier anode electrode and an amplifier cathode electrode;
   a semiconductor laser, coupled to the substrate and including a semiconductor laser anode electrode and a semiconductor laser cathode electrode;
   an electro-absorption modulated laser (EML) package that encloses the semiconductor laser and the SOA, the EML package including:
      a first electrical contact electrically coupled to at least one of the anode electrode of the SOA or the anode electrode of the semiconductor laser;
      a second electrical contact electrically coupled to at least one of the cathode electrode of the SOA or the cathode electrode of the semiconductor laser; and
      an optical output port configured to provide an output amplified optical signal; and
   at least one of:
      a thermo-electric cooler (TEC) thermally coupled to the substrate, the TEC electrically coupled to a third electrical contact and a fourth electrical contact of the EML package;
      a feedback monitor optically coupled to the semiconductor laser, the feedback monitor being electrically coupled to a fifth electrical contact and a sixth electrical contact of the EML package; or an optical modulator optically coupled to the SOA, the optical modulator being electrically coupled to a seventh electrical contact of the EML package;

wherein;

the semiconductor laser and the SOA are configured on the substrate so that the laser is optically coupled to the SOA; and at least one of the semiconductor laser anode electrode or semiconductor laser cathode electrode is electrically coupled to at least one of the amplifier anode electrode or amplifier cathode electrode such that the semiconductor laser and the SOA are electrically connected in series or in parallel.

* * * * *